US009952699B2

(12) United States Patent
Long et al.

(10) Patent No.: US 9,952,699 B2
(45) Date of Patent: Apr. 24, 2018

(54) TOUCH ELECTRODE STRUCTURE, TOUCH PANEL AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventors: Yue Long, Beijing (CN); Weiyun Huang, Beijing (CN); Yang Wang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 15/109,690

(22) PCT Filed: Dec. 18, 2015

(86) PCT No.: PCT/CN2015/097884
§ 371 (c)(1),
(2) Date: Jul. 5, 2016

(87) PCT Pub. No.: WO2017/035998
PCT Pub. Date: Mar. 9, 2017

(65) Prior Publication Data
US 2017/0235395 A1 Aug. 17, 2017

(30) Foreign Application Priority Data
Aug. 28, 2015 (CN) .......................... 2015 1 0543665

(51) Int. Cl.
*G06F 3/041* (2006.01)
*G02F 1/1333* (2006.01)
(Continued)

(52) U.S. Cl.
CPC ........ *G06F 3/0412* (2013.01); *G02F 1/13338* (2013.01); *G06F 3/044* (2013.01); *G06F 3/0416* (2013.01); *H01L 27/323* (2013.01)

(58) Field of Classification Search
None
See application file for complete search history.

(56) References Cited

U.S. PATENT DOCUMENTS

2005/0110768 A1* 5/2005 Marriott .............. G06F 3/03547
345/173
2009/0267870 A1* 10/2009 Schellingerhout ......................... G02F 1/133305
345/55

(Continued)

FOREIGN PATENT DOCUMENTS

CN 2836072 Y 11/2006
CN 103268176 A 8/2013
(Continued)

OTHER PUBLICATIONS

Search Report and Written Opinion dated Apr. 21, 2016 from State Intellectual Property Office of the P.R. China.
Chinese Office Action dated Aug. 1, 2017.

*Primary Examiner* — Jennifer Mehmood
*Assistant Examiner* — Krishna P Neupane
(74) *Attorney, Agent, or Firm* — Dilworth & Barrese, LLP; Michael J. Musella, Esq.

(57) ABSTRACT

A touch electrode structure, a touch panel and a display device are provided. The touch electrode structure includes at least one first touch electrode (101) and a plurality of second touch electrodes (102), the at least one first touch electrode is of annular shape; the plurality of second touch electrodes (102) are insulated from the at least one first touch electrode (101), the plurality of second touch electrodes (102) are arranged along a circumferential direction of the annular first touch electrode (101) and extend along a radial direction of the annular first touch electrode (101), so as to overlap the at least one first touch electrode (101). The touch electrode structure may be used in a non-rectangular touch (Continued)

panel, which can solve a problem that an edge of the touch panel or the touch electrode at the corner is not completely or evenly covered.

20 Claims, 6 Drawing Sheets

(51) Int. Cl.
*G06F 3/044* (2006.01)
*H01L 27/32* (2006.01)

(56) References Cited

U.S. PATENT DOCUMENTS

| | | | | |
|---|---|---|---|---|
| 2010/0301879 | A1* | 12/2010 | Philipp | G06F 3/03547 324/679 |
| 2011/0248954 | A1* | 10/2011 | Hamada | G06F 3/03547 345/174 |
| 2013/0346008 | A1* | 12/2013 | Bulea | G06F 3/0418 702/85 |
| 2014/0267945 | A1 | 9/2014 | Lee et al. | |

FOREIGN PATENT DOCUMENTS

| | | |
|---|---|---|
| CN | 103309488 A | 9/2013 |
| CN | 203276235 U | 11/2013 |
| CN | 204102095 U | 1/2015 |
| CN | 204360355 U | 5/2015 |
| CN | 105068693 A | 11/2015 |
| JP | 2014095968 A | 5/2014 |
| WO | 03088176 A1 | 10/2003 |

* cited by examiner

TOUCH ELECTRODE STRUCTURE, TOUCH PANEL AND DISPLAY DEVICE

TECHNICAL FIELD

At least one embodiment of the present disclosure relates to a touch electrode structure, a touch panel and a display device.

BACKGROUND

As a brand new human-computer interaction device, a touch screen improves efficiency and convenience of man-machine dialogue to a large extent, and can allow entertainment and official business to become more lively and relaxed, due to characteristics such as directness, high efficiency, accuracy, smoothness, and fashion. The touch screen can be divided into a resistive type, a capacitive type, an infrared optical type and other types. Typically, the touch screen of the capacitive type includes a touch screen of a self-capacitive type and a touch screen of a mutual-capacitive type.

The touch screen of the self-capacitive type includes a touch electrode array made from a transparent conductive material (e.g., Indium Tin Oxide (ITO)) on a base substrate, and these touch electrodes respectively constitute capacitors with ground. When a finger touches the touch screen of the self-capacitive type, capacitance of the finger will be superimposed on a corresponding touch electrode, and a touch detection chip may determine a touch position in a touch period by detecting change of capacitance values of the respective touch electrodes. The touch screen of the mutual-capacitive type includes a lateral electrode and a longitudinal electrode made from the transparent conductive material (e.g., Indium Tin Oxide (ITO)) on the base substrate, and capacitance will be formed in a position where the two sets of electrodes intersect with each other. When the finger touches a capacitive screen, coupling between two electrodes near a touch point is affected, so that capacitance between the two electrodes is changed. The touch detection chip determines the touch position in the touch period by detecting such a change of the capacitance value.

On the other hand, with development of smart technology, a wearable smart device is more and more favored by consumers. These smart devices, in addition to characteristics such as portability, fashion, and intellectualization, almost all need a touch performance. However, shapes of touch screens of these smart devices are not rigidly limited to a general rectangle, but a variety of shapes such as a circle and an octagon can be adopted, so as to meet a user's demands on fashion and aesthetics. However, because its touch screen is non-rectangular (heteromorphic), a touch electrode structure originally used in a rectangular device is no longer applicable. The original touch electrode structure continues to be used on the heteromorphic touch panel, and all sorts of problems may be encountered, for example, an edge of the touch panel or the touch electrode at the corner is not completely or evenly covered, resulting in defects such as inaccurate reporting points, or poor linearity.

SUMMARY

At least one embodiment of the invention provides a touch electrode structure, a touch panel and a display device.

The touch electrode structure may be used in a non-rectangular touch panel, which can solve a problem that an edge of the touch panel or the touch electrode at the corner is not completely or evenly covered.

At least one embodiment of the invention provides a touch electrode structure, comprising at least one first touch electrode and a plurality of second touch electrodes, wherein, the at least one first touch electrode is of annular shape;

the plurality of second touch electrodes are insulated from the at least one first touch electrode, the plurality of second touch electrodes are arranged along a circumferential direction of the annular first touch electrode and extend along a radial direction of the annular first touch electrode, so as to overlap the at least one first touch electrode.

For example, the touch electrode structure provided in an embodiment comprises a plurality of first touch electrodes, wherein, each of the plurality of first touch electrodes is of annular shape, and the plurality of first touch electrodes are sequentially arranged to constitute a set of concentric rings, the plurality of first touch electrodes are insulated from each other, the plurality of second touch electrodes are arranged along a circumferential direction of the concentric rings and extend along a radial direction of the concentric rings, so as to overlap at least one on an outermost side in the plurality of first touch electrodes.

For example, in the touch electrode structure provided an embodiment, the plurality of second touch electrodes include a first electrode group and a second electrode group, the first electrode group extends from an outermost ring to an innermost ring of the concentric rings; and the second electrode group extends from the outermost ring to a middle ring of the concentric rings.

For example, in the touch electrode structure provided an embodiment, the plurality of second touch electrodes are evenly arranged along the circumferential direction of the concentric rings.

For example, the touch electrode structure provided in an embodiment further comprises a solid third touch electrode, wherein, the third touch electrode is located in a center of the annular first touch electrode, and is insulated from the respective first touch electrodes and the respective second touch electrodes.

For example, in the touch electrode structure provided an embodiment, the third touch electrode overlaps one of the plurality of second touch electrodes.

For example, in the touch electrode structure provided an embodiment, the third touch electrode does not overlap any one of the plurality of second touch electrodes.

For example, in the touch electrode structure provided an embodiment, the annular shape includes a circular ring, an elliptical ring or a polygonal ring.

For example, in the touch electrode structure provided an embodiment, the polygonal ring is a regular polygonal ring.

For example, in the touch electrode structure provided an embodiment, the annular shape is closed or open.

For example, in the touch electrode structure provided an embodiment, the first touch electrode is a touch driving electrode, and the second touch electrode is a touch sensing electrode; or the first touch electrode is a touch sensing electrode, and the second touch electrode is a touch driving electrode.

For example, the touch electrode structure provided in an embodiment further comprises a plurality of leads, wherein, the plurality of leads are respectively connected with the respective first touch electrodes and the respective second touch electrodes so as to be used for inputting/outputting a signal.

For example, in the touch electrode structure provided an embodiment, a material of the at least one first touch electrode and/or the plurality of second touch electrodes is a transparent conductive material.

For example, at least one embodiment of the invention provides a touch panel, comprising the touch electrode structure according to any embodiment.

For example, at least one embodiment of the invention provides a display device, comprising the touch electrode structure according to any embodiment.

For example, the display device provided in an embodiment further comprises a display panel, wherein, the display panel includes the touch electrode structure.

For example, the display device provided in an embodiment further comprises a display panel and a touch panel disposed on a display side of the display panel, the touch panel including the touch electrode structure.

For example, in the display device provided in an embodiment, the display panel includes a liquid crystal display panel or an organic light emitting diode display panel.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

REFERENCE SIGNS

100—concentric ring; 101—first touch electrode; 1011—first annular first touch electrode; 1012—second annular first touch electrode; 1013—third annular first touch electrode; 1014—fourth annular first touch electrode; 1015—fifth annular first touch electrode; 102—second touch electrode; 1021—first electrode group; 1022—second electrode group; 103—third touch electrode; 110—base substrate; 111—lead; 112—touch detection chip; 114—second insulating layer; 115—via hole; 116—first insulating layer; 120—opening; 130—touch panel; 131—display panel; 1311—lower substrate; 1312—upper substrate.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, technical terms or scientific terms used in the present disclosure should be of general meaning as understood by those ordinarily skilled in the art. "First", "second" and similar words used in the present disclosure do not represent any sequence, quantity or importance and merely intend to differentiate different composite parts. Similarly, words such as "a", "an" or "the" or the like do not denote quantitative limitation, but rather indicate there is at least one. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right" and the like are only used for expressing relative positional relationship, when the absolute position of a described object is changed, the relative positional relationship may also be correspondingly changed.

At least one embodiment of the present disclosure provides a touch electrode structure, and a touch panel and a display device comprising the touch electrode structure. The touch electrode structure comprises at least one first touch electrode and a plurality of second touch electrodes, wherein, the at least one first touch electrode is annular; the plurality of second touch electrodes are insulated from the at least one first touch electrode, the plurality of second touch electrodes are arranged along a circumferential direction of the annular first touch electrode and extend along a radial direction of the annular first touch electrode, so as to overlap the at least one first touch electrode.

The touch electrode structure may be used in a non-rectangular touch panel, which can solve a problem that, for example, an edge of the touch panel or the touch electrode at the corner are not completely or evenly covered, resulting in defects such as inaccurate reporting points, or poor linearity, and which expands an application range of the touch device, and reduces difficulty of control. The non-rectangle includes, for example, a circle, a sector, a sector ring, a polygon, a polygonal ring, and so on.

Hereinafter, it is illustrated through several embodiments.

Embodiment One

Figure 1A:
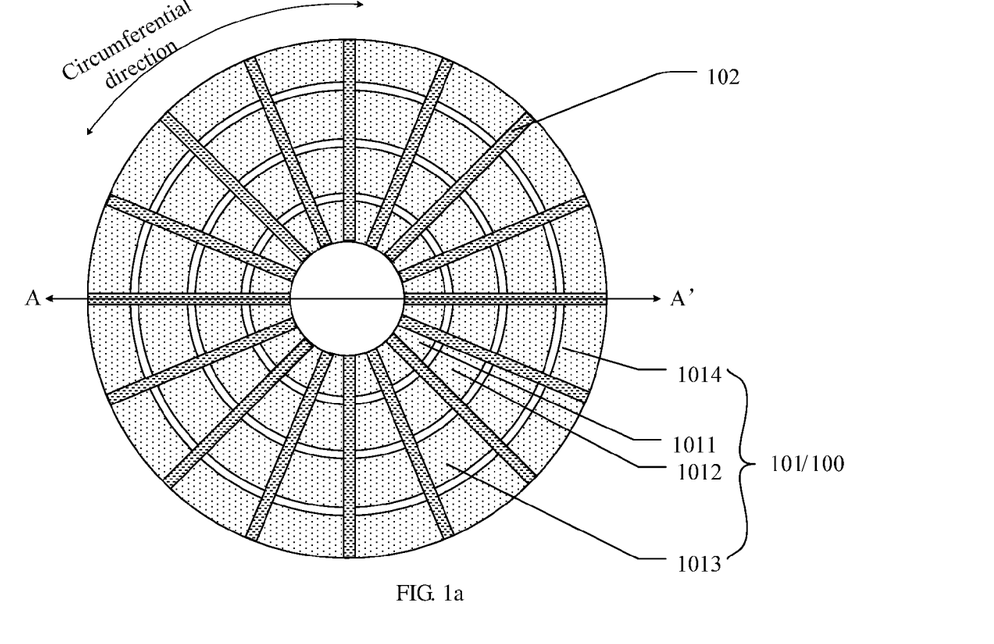
FIG. 1a is a plane schematic diagram of a touch electrode structure provided by an embodiment of the present disclosure.

This embodiment provides a touch electrode structure. As shown in FIG. 1a, the touch electrode structure comprises a plurality of first touch electrodes 101 and a plurality of second touch electrodes 102. Each of the plurality of first touch electrodes 101 is annular and the first touch electrodes are insulated from each other. The plurality of first touch electrodes 101 are sequentially arranged to constitute a set of concentric rings 100. The plurality of second touch electrodes 102 is disposed to insulate from the above-described plurality of first touch electrodes 101, and arranged along a circumferential direction of the concentric ring 100 (the annular first touch electrode) and extend along a radial direction of the concentric ring 100 (the annular first touch electrode), so as to overlap at least one first touch electrode 101. For example, as shown in FIG. 1a, the plurality of first touch electrodes 101 include a plurality of first touch electrodes 101 sequentially disposed outwardly from a center. For example, the structure shown in FIG. 1a comprises a first annular first touch electrode 1011, a second annular first touch electrode 1012, a third annular first touch electrode 1013 and a fourth annular first touch electrode 1014, so as to constitute a set of concentric rings 100. In addition, two adjacent annular first touch electrodes 101 are disposed to separate from each other by a certain interval, so as to be insulated from each other.

Figure 2A:
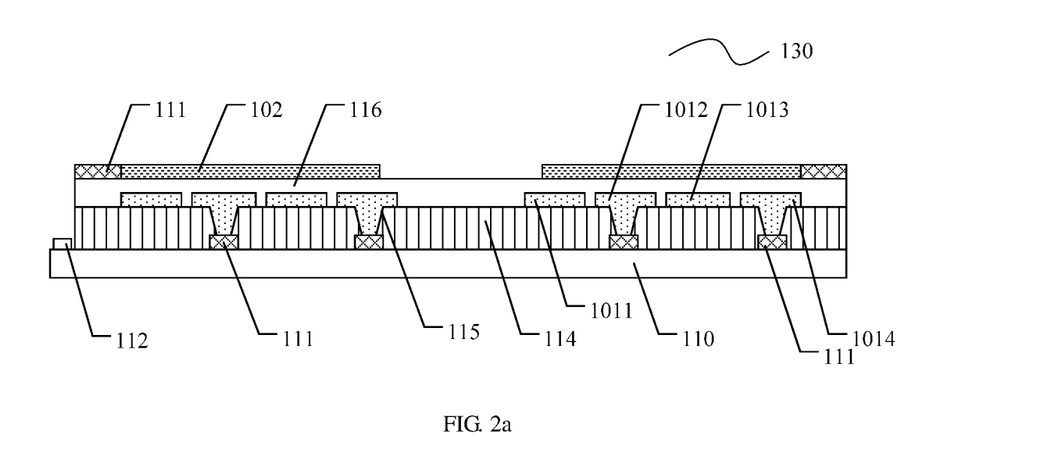
FIG. 2a is a cross-sectional schematic diagram of a touch electrode structure along an A-A' direction in FIG. 1a provided by an embodiment of the present disclosure.
Figure 2B:
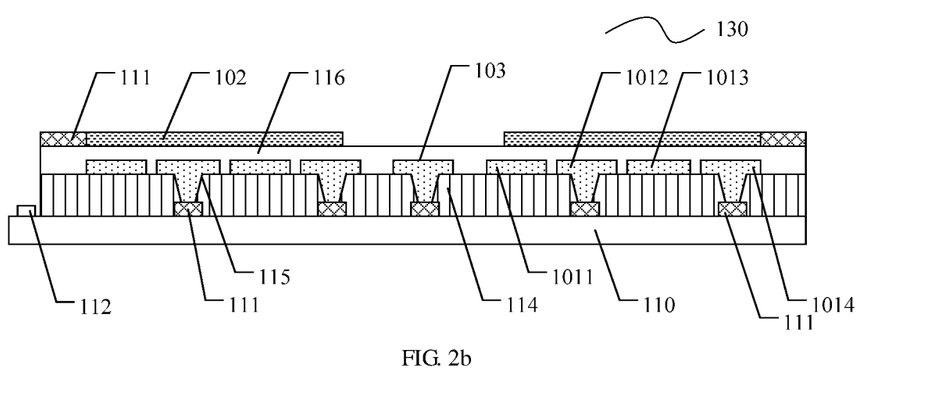
FIG. 2b is a cross-sectional schematic diagram of a touch electrode structure along an B-B' direction in FIG. 1c provided by an embodiment of the present disclosure.

For example, as shown in FIG. 1a, the plurality of second touch electrodes 102 are insulated from the plurality of first touch electrodes 101, arranged along the circumferential direction of the concentric ring 100 and extend along the radial direction of the concentric ring 100, so as to overlap the plurality of first touch electrodes 101. For example, the plurality of second touch electrodes 102 extend from a position corresponding to the first annular first touch electrode 1011 to a position corresponding to the fourth annular first touch electrode 1014, so as to overlap the first annular first touch electrode 1011, the second annular first touch electrode 1012, the third annular first touch electrode 1013 and the fourth annular first touch electrode 1014 as described above. That is, the plurality of second touch electrodes 102 and the plurality of first touch electrodes 101 overlap with each other. For example, as shown in FIG. 2a and FIG. 2b, a first insulating layer 116 may be disposed between the plurality of first touch electrodes 101 and the plurality of second touch electrodes 102, in order to achieve a purpose of insulating from each other.

In the touch electrode structure provided by Embodiment One, as shown in FIG. 1a, the plurality of second touch electrodes 102 are evenly arranged along the circumferential direction of the concentric ring 100. It is noteworthy that, the plurality of second touch electrodes 102 may also be unevenly arranged along the concentric ring 100, and an interval and an angle between the plurality of second touch electrodes 102 may be adjusted according to specific use environments and needs.

Figure 1B:
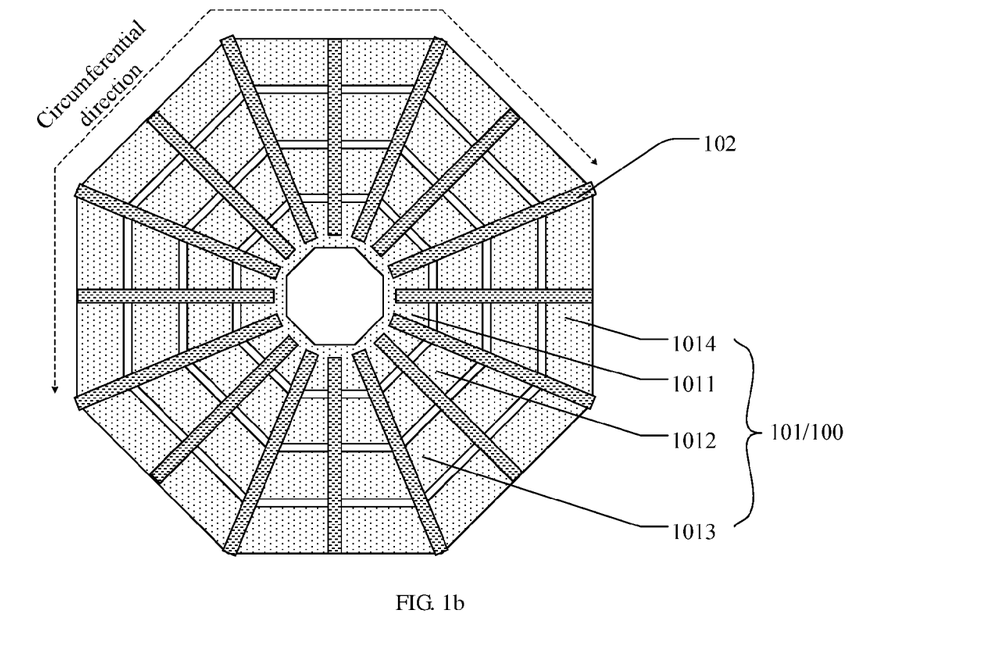
FIG. 1b is a plane schematic diagram of another touch electrode structure provided by an embodiment of the present disclosure.

In the touch electrode structure provided by Embodiment One, as shown in FIG. 1a, the concentric ring 100 is a concentric circular ring, and correspondingly, the plurality of first touch electrodes 101 are concentric circular rings. Of course, this embodiment includes, but is not limited thereto. For example, the plurality of first touch electrodes 101 may further be concentric elliptical rings or concentric polygonal rings. For example, the circular ring in FIG. 1a is replaced by an elliptical ring or a polygonal ring, so as to form the first touch electrode of the elliptical ring or the polygonal ring. Thus, the plurality of first touch electrodes constitutes the concentric elliptical rings or the concentric polygonal rings. For example, the polygonal ring includes a regular polygonal ring. For example, as shown in FIG. 1b, each first touch electrode 101 is a regular octagonal ring. The plurality of first touch electrodes 101 are sequentially arranged to constitute a set of concentric regular octagonal rings. For example, the concentric rings have a center. The center, for example, is a center of a circle or a center of gravity of the concentric rings.

In the respective embodiments of the present disclosure, the radial direction of the concentric rings is, for example, a direction of a radius of a circle with centers of the concentric rings as a center of the circle, or, the radial direction of the concentric rings is, for example, a direction of a radial line emanating from the center of the concentric rings (e.g., the center of the circle). The circumferential direction of the concentric rings is, for example, a direction of a circumference of a circle with the centers of the concentric rings (e.g., the center of the circle) as the center of the circle.

It should be noted that, the radial direction of the annular first touch electrode is, for example, a direction of a radius of a circle with the center of the annular first touch electrode as the center of the circle, or, the radial direction of the annular first touch electrode is, for example, a direction of a radial line of a circle with the center of the annular first touch electrode (e.g., the center of the circle) as the center of the circle (a direction along the radius or the diameter). The circumferential direction of the annular first touch electrode is, for example, a direction of a circumference of the annular first touch electrode, for example, a direction of a circumference of an inner ring or an outer ring of the annular first touch electrode. The inner ring or the outer ring includes, for example, a circular ring, an elliptical ring, or a polygonal ring. Alternatively, the circumferential direction of the annular first touch electrode is, for example, a direction of a circumference of a circle with the center of the annular first touch electrode as the center of the circle. The center, for example, refers to a center of a circle or a center of gravity of the annular first touch electrode. Respective embodiments below may be the same.

Figure 1C:
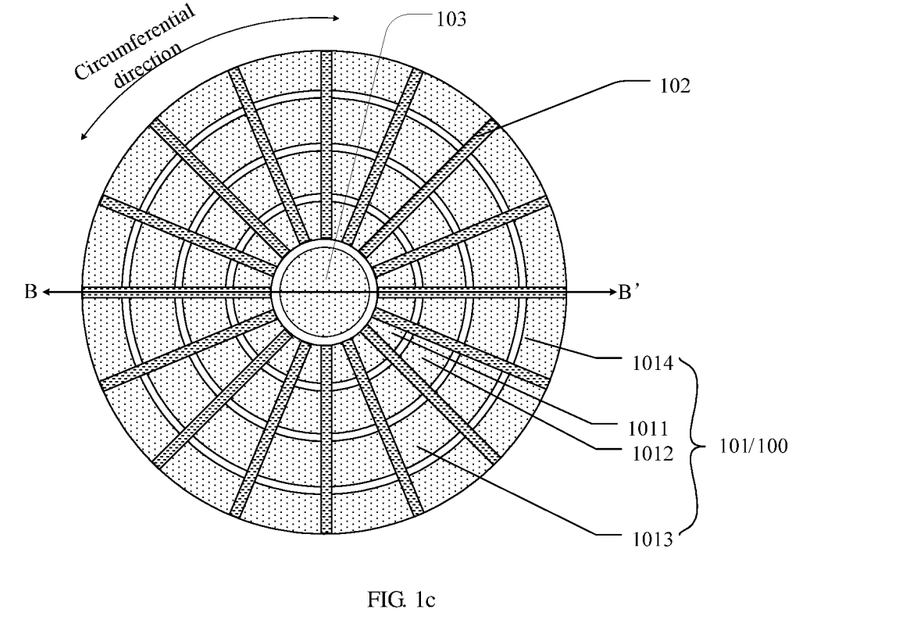
FIG. 1c is a plane schematic diagram of another touch electrode structure provided by an embodiment of the present disclosure.

For example, as shown in FIG. 1c, in one example of this embodiment, the touch electrode structure may further include a solid third touch electrode 103, the third touch electrode 103 is located in the center of the concentric ring 100 (the annular first touch electrode), insulated from the plurality of first touch electrodes 101 and the plurality of second touch electrodes 102, and does not overlap any one of the second touch electrodes 102. The third touch electrode 103 may operate in a mode of a self-capacitive touch electrode. In such a case, a touch chip, when performing touch detection, may firstly scan the first touch electrode 101, then scan the second touch electrode 102, process a scan result in a mode of mutual-capacitive touch, and then scan the third touch electrode, process a scan result in a mode of self-capacitive touch, and determine whether there is a position of touch operation and possible touch operation in conjunction with the above-described scanning results.

The plurality of first touch electrodes 101 of this embodiment, for example, may be corresponding concentric annular electrodes disposed according to a shape of a non-rectangular (heteromorphic) touch panel as required. For example, the plurality of first touch electrodes in the circular touch panel may be concentric circular rings, the plurality of first touch electrodes in the polygonal touch panel may be concentric polygonal rings, and the plurality of first touch electrodes in the elliptical touch panel may be concentric elliptical rings. Thus, the touch electrode structure provided by this embodiment may completely cover the entire heteromorphic touch panel, which thus can avoid various defects of touch performance brought by incomplete coverage.

For example, the touch electrode structure (wherein the touch electrode structure does not include the third touch electrode) as shown in FIG. 1a and FIG. 1b may be applied to the circular or polygonal touch panel, and a shape of the touch panel including the touch electrode structure may also be a circular ring or a polygonal ring, which will not be limited by the present disclosure.

In the touch electrode structure provided by this embodiment, as shown in FIG. 1a and FIG. 1b, each of the plurality of first touch electrodes 101 is an enclosed ring. Of course, the present disclosure includes, but is not limited thereto, each of the plurality of first touch electrodes 101 may be a ring having an opening.

It should be noted that, in the respective embodiments of the present disclosure, the first touch electrode 101 is annular, including an enclosed annulus and an annulus having an opening. The annulus having an opening, for example, includes a sector ring or a polygonal ring having an opening. The polygonal ring having an opening, for example, includes a triangular ring, a pentagonal ring, a hexagonal ring, a heptagonal ring, an octagonal ring and so on, having an opening.

In one example of this embodiment, the touch electrode structure may further comprise a plurality of leads 111, and as shown in FIG. 2a, the plurality of leads 111 may be respectively connected with the plurality of first touch electrodes 101 and the plurality of second touch electrodes 102 so as to be used for inputting/outputting a signal.

For example, as shown in FIG. 2a, in one example of this embodiment, the touch electrode structure is disposed on a base substrate 110, the touch electrode structure may further comprise the plurality of leads 111 and the second insulating layer 114 disposed below the plurality of first touch electrodes 101. For example, a portion of the plurality of leads 111 are disposed on the first insulating layer 116, which may be directly disposed on a same layer with the plurality of second touch electrodes 102 and connected with an outward end of the plurality of second touch electrodes 102. The plurality of first touch electrodes 101 are connected with a second portion of the plurality of leads 111 disposed below the second insulating layer 114 through a via hole 115 in the second insulating layer 114, so as to implement inputting/outputting a signal to the plurality of first touch electrodes, the plurality of second touch electrodes, and the third touch electrode.

For example, a material of the first insulating layer 116 and the second insulating layer 114 includes one or more of silicon nitride (SiNx), silicon oxide (SiOx), silicon nitride oxide (SiNxOy), but is not limited thereto.

For example, as shown in FIG. 2b, in one example of this embodiment, the plurality of leads 111 further include a third portion, and the third touch electrode 103 is also connected with the third portion of the plurality of leads 111 disposed below the second insulating layer 114 through the via hole 115 in the second insulating layer 114. For example, the third portion of the leads may be one lead.

It should be noted that, a position and a configuration mode of the above-described plurality of leads 111 can be arranged in other manners, which will not be specifically limited by the embodiment of the present disclosure.

For example, as shown in FIGS. 2a and 2b, the plurality of leads 111 may be connected with the touch detection chip 112, the touch detection chip 112 inputs/outputs a signal through the lead 111, and receives signals of the respective touch electrodes by analysis, so as to determine the touch position. The touch detection chip 112 may be provided either separately, or integrally formed with other computing devices, which, for example, may be implemented by a dedicated computing device (e.g., a Digital Signal Processor (DSP), etc.), and may also be implemented by a general-purpose computing device (a Central Processing Unit (CPU)), and respective embodiments below may be the same.

For example, in one example of this embodiment, a material of the plurality of first touch electrodes 101 and/or the plurality of second touch electrodes 102 and/or the third touch electrode 103 may be a transparent conductive material. For example, the transparent conductive material includes Indium Tin Oxide (ITO), Indium Zinc Oxide (IZO) and other transparent metal oxides. Alternatively, for example, the plurality of first touch electrodes 101 are prepared from the transparent conductive material, and the plurality of second touch electrodes 102 are prepared by a metal wire 102, for example, as long as a normal display effect is not influenced, and respective embodiments below may be the same.

For example, the touch electrode (e.g., the first touch electrode, the second touch electrode or the third touch electrode) in the touch electrode structure provided by this embodiment may be formed by a patterning process, but is not limited thereto. Respectively embodiments below may be the same.

It should be understood that, in the respective embodiments of the present disclosure, the patterning process may only include a photolithography process, or include the photolithography process and an etching step, or include printing, ink jet and other processes for forming a predetermined pattern. The photolithography process refers to a technical process including film formation, exposure, development and so on, and forming a pattern by using photoresist, a mask plate, an exposure machine, and so on. A corresponding patterning process may be selected according to a structure formed in the respective embodiments of the present disclosure.

It should be noted that, in FIG. 1a and FIG. 1b of this embodiment, the plurality of first touch electrodes 101 include 4 annular first touch electrodes, but the number of the annular first touch electrodes is not limited thereto. The "plurality of" according to the embodiment of the present disclosure refers to more than one, i.e., greater than or equal to two. According to requirements such as an optical property of the transparent conductive material used, a size of the touch panel, precision and an aperture ratio, the number and the interval of the plurality of first touch electrodes 101 and the plurality of second touch electrodes 102 may change according to an actual situation. For example, when the transparent conductive material used has a lower transparency, and a required precision is lower, in order to increase the aperture ratio, the number of the plurality of first touch electrodes 101 may be reduced, the interval thereof is increased; the number of the plurality of second touch electrodes 102 is reduced, and the interval thereof is increased. Conversely, when the transparent conductive material used has a higher transparency, and a required precision is higher, the number of the first touch electrodes 101 may be increased, the interval thereof is reduced; the number of the plurality of second touch electrodes 102 is increased, and the interval thereof is reduced.

In addition, the touch electrode structure provided by this embodiment not only can be applied to a conventional planar touch panel, but also, due to its unique arrangement mode of the touch electrodes, can be applied to a touch panel of a curved surface, even a touch panel of a spherical surface, and can always achieve a better touch effect. For example, when the touch electrode structure shown in FIG. 1a is used in a spherical surface, the annular touch electrode is disposed corresponding to a "latitude" of the spherical surface, and the touch electrode of the radial direction is disposed corresponding to a "longitude" of the spherical surface.

In this embodiment, the plurality of first touch electrodes 101 and the plurality of second touch electrodes 102 form a capacitor in an overlapping position; and when there is a finger touch, coupling of capacitor near the touch point is influenced, so as to change capacitance of the capacitor near the touch point. Thus, the touch position can be determined by using such a change of the capacitance. Further, the plurality of first touch electrodes 101 of this embodiment may be any concentric annular electrode disposed according to the shape of the heteromorphic touch panel as required, which can effectively and completely cover the heteromorphic touch panel, avoid defects such as inaccurate reporting points or poor linearity because an edge of the touch panel or the touch electrode at the corner is not completely covered.

Embodiment Two

Figure 3:
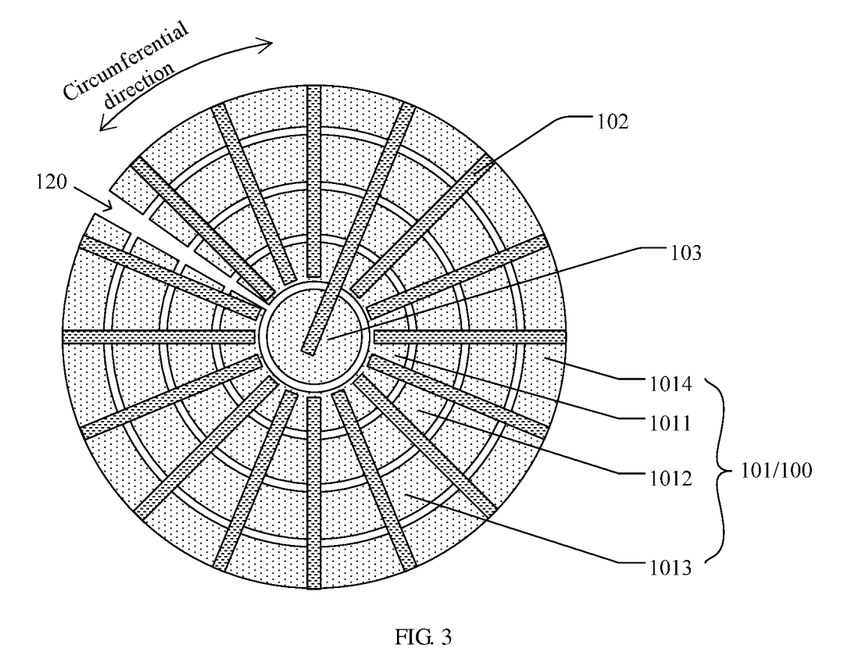
FIG. 3 is a plane schematic diagram of a touch electrode structure provided by another embodiment of the present disclosure.

This embodiment provides a touch electrode structure. As shown in FIG. 3, the touch electrode structure comprises a plurality of first touch electrodes 101 and a plurality of second touch electrodes 102.

For example, as shown in FIG. 3, the plurality of first touch electrodes 101 includes a first annular first touch electrode 1011, a second annular first touch electrode 1012, a third annular first touch electrode 1013 and a fourth annular first touch electrode 1014 arranged sequentially from inside to outside concentrically, so as to constitute a set of concentric rings 100. In addition, two adjacent annular first touch electrodes are disposed separated from each other by a certain interval, so as to be insulated from each other.

For example, as shown in FIG. 3, the plurality of second touch electrodes 102 are disposed on and insulated from the plurality of first touch electrodes 101, and the plurality of second touch electrodes 102 are arranged along a circumferential direction of the concentric ring 100 and extend along a radial direction of the concentric ring 100, so as to overlap the first annular first touch electrode 1011, the second annular first touch electrode 1012, the third annular first touch electrode 1013 and the fourth annular first touch electrode 1014 as described above. That is, the plurality of second touch electrodes 102 and the plurality of first touch electrodes 101 overlap with each other. For example, as shown in FIG. 2a, a first insulating layer 116 may be disposed between the plurality of first touch electrodes 101 and the plurality of second touch electrodes 102, in order to achieve a purpose of insulating from each other.

It should be noted that, in the respective embodiments of the present disclosure, a layer where the plurality of second touch electrodes 102 are located is located above a layer where a plurality of first touch electrodes 101 are located, but positional relationship between the plurality of second touch electrodes 102 and the plurality of first touch electrodes 101 is not limited thereto. For example, the layer where the plurality of second touch electrodes 102 are located may also be located below the layer where the plurality of first touch electrodes 101 are located. Respectively embodiments below may be the same.

For example, in the touch electrode structure provided by this embodiment, as shown in FIG. 3, the concentric ring 100 is a concentric circular ring. The plurality of first touch electrodes 101 constitutes the concentric circular rings. Of course, this embodiment includes, but is not limited thereto. For example, the plurality of first touch electrodes 101 may further be concentric elliptical rings or concentric polygonal rings. For example, the concentric polygonal ring is a concentric regular polygonal ring, for example, a concentric triangular ring, a concentric regular pentagonal ring, a concentric regular hexagonal ring, a concentric regular heptagonal ring, a concentric regular octagonal ring and so on. That is to say, the plurality of first touch electrodes 101 of this embodiment may be any concentric annular electrode disposed according to the shape of the heteromorphic touch panel as required. Thus, the touch electrode structure provided by this embodiment may completely cover the entire heteromorphic touch panel, in order to avoid various touch defects brought by incomplete coverage.

In the touch electrode structure provided in this embodiment, as shown in FIG. 3, the plurality of second touch electrodes 102 are evenly arranged along the circumferential direction of the concentric ring 100. It is noteworthy that, the plurality of second touch electrodes 102 may also be unevenly arranged along the concentric ring 100, and an interval and an angle between the plurality of second touch electrodes 102 may be adjusted according to specific use environments and needs.

In one example of this embodiment, the touch electrode structure further includes a solid third touch electrode 103, the third touch electrode 103 is located in the center of the concentric ring 100, and is insulated from the plurality of first touch electrodes 101 and the plurality of second touch electrodes 102.

For example, as shown in FIG. 3, the third touch electrode 103 is located in the center of the concentric ring, e.g., disposed inside the first annular first touch electrode 1011, and is separated from the innermost annular first touch electrode (the first annular first touch electrode 1011), so as to be insulated from the plurality of first touch electrodes 101 and the plurality of second touch electrodes 102.

For example, as shown in FIG. 3, the third touch electrode 103 overlaps one of the plurality of second touch electrodes 102 which extends to the center. Thus, the third touch electrode 103 and the second touch electrode 102 which extends to the center may constitute a touch electrode structure of a mutual-capacitive type, so as to increase touch precision of a center position of the touch panel/the touch display device of the touch electrode structure provided by this embodiment. In such a case, a touch chip, when performing touch detection, may firstly scan the first touch electrode 101, then scan the second touch electrode 102 and the third touch electrode 103, process a scan result in a mode of mutual-capacitive touch, and thereby determine whether there is a position of touch operation and possible touch operation.

It should be noted that, as described above, the third touch electrode 103 may not overlap any one of the plurality of second touch electrodes 102. In this case, the third touch electrode 103 per se constitutes a touch electrode structure of a self-capacitive type, and can also increase the touch precision of the center position of the touch panel using the touch electrode structure provided by this embodiment.

For example, as shown in FIG. 3, in one example of this embodiment, the third touch electrode 103 is circular. Of course, this embodiment includes, but is not limited thereto. For example, the third touch electrode 103 may also be elliptical, polygonal, or of other shapes. That is to say, the shape of the third touch electrode 103 according to this embodiment may be determined according to the shape of the touch panel/the display device or the shape of the first annular first touch electrode 1011. In addition, when the plurality of first touch electrodes 101 have an opening, the third touch electrode 103 may correspondingly have an opening.

For example, in the touch electrode structure provided by this embodiment, the annular electrode constituted by each of the plurality of first touch electrodes 101 may have an opening. For example, as shown in FIG. 3, the plurality of first touch electrodes 101 have an opening 120.

Figure 4:
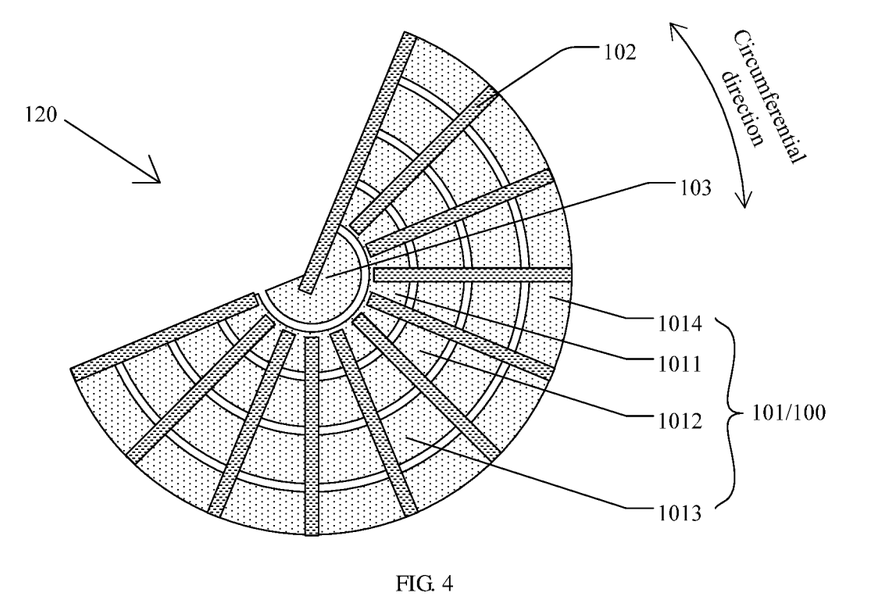
FIG. 4 is a plane schematic diagram of a touch electrode structure provided by another embodiment of the present disclosure.

For example, as shown in FIG. 4, the plurality of first touch electrodes 101 have a larger opening 120. Thus, the touch electrode structure may constitute a sector-shaped touch electrode structure. For example, it may be applied to a sector-shaped touch panel. Of course, the present disclosure includes, but is not limited thereto, and each of the plurality of first touch electrodes 101 may be an enclosed ring.

For example, in this embodiment, the touch electrode structure may further comprise a plurality of leads 111, with reference to FIG. 2a and FIG. 2b, the plurality of leads 111 are respectively connected with the plurality of first touch electrodes 101 and the plurality of second touch electrodes 102 so as to be used for inputting/outputting a signal, or the plurality of leads 111 are respectively connected with the plurality of first touch electrodes 101, the plurality of second touch electrodes 102, and the third touch electrode 103 so as to be used for inputting/outputting a signal. Illustration of Embodiment One may be referred to for a specific configuration mode of the plurality of leads 111, which will not be repeated here.

For example, the plurality of leads 111 may be connected with the touch detection chip 112, the touch detection chip 112 inputs/outputs a signal through the lead 111, and receives signals of the respective touch electrodes by analysis, so as to determine the touch position.

For example, in one example of this embodiment, a material of the plurality of first touch electrodes 101 and/or the plurality of second touch electrodes 102 may be a transparent conductive material, but is not limited thereto. For example, the transparent conductive material may be Indium Tin Oxide (ITO), Indium Zinc Oxide (IZO) and other transparent metal oxides. It should be noted that, the transparent conductive material is not limited to the several types as exemplified above. Description of the foregoing embodiment may be referred to for the material of the first touch electrodes 101 and/or the second touch electrodes 102 and/or the third touch electrode 103.

In this embodiment, a capacitive structure may be formed between the plurality of first touch electrodes 101 and the plurality of second touch electrodes 102, or between the plurality of first touch electrodes 101 and the plurality of second touch electrodes 102 as well as in a position where the third touch electrode 103 disposed in the center of the concentric ring 100 overlaps the second touch electrode 102 which extends to the center. When there is a finger touch, coupling of capacitor near the touch point is influenced, so as to change capacitance of the capacitor near the touch point. Thus, the touch position can be determined by using such a change of the capacitance. Further, the plurality of first touch electrodes 101 of this embodiment may be any concentric annular electrode disposed according to the shape of the heteromorphic touch panel as required, which can effectively and completely cover the heteromorphic touch panel, avoid defects such as inaccurate reporting points or poor linearity because an edge of the touch panel or the touch electrode at the corner is not completely covered. In addition, the third touch electrode 103 disposed in the center of the concentric ring 100 can improve touch precision of a center position of the touch panel using the touch electrode structure provided by this embodiment.

Further, the touch electrode structure provided by this embodiment may, by combining with a general touch electrode structure, form a variety of heteromorphic touch electrode structures, achieve a better touch performance, and in addition, may have characteristics of fashion and aesthetics, so as to meet various needs of the user.

Embodiment Three

Figure 5A:
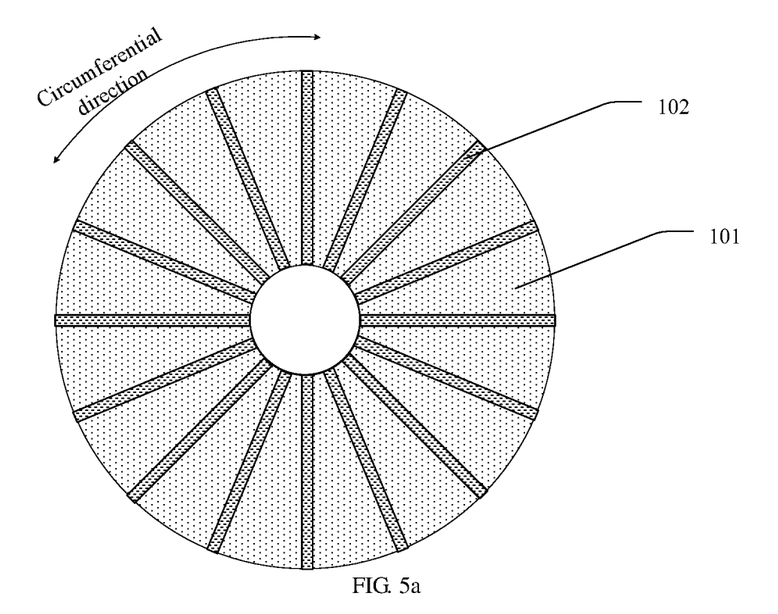
FIG. 5a is a plane schematic diagram of a touch electrode structure provided by another embodiment of the present disclosure.

As shown in FIG. 5a, this embodiment provides a touch electrode structure, the touch electrode structure comprising one first touch electrode 101 and a plurality of second touch electrodes 102, the one first touch electrode 101 being annular; the plurality of second touch electrodes 102 being insulated from the one first touch electrode 101, the plurality of second touch electrodes 102 being arranged along the circumferential direction of the annular first touch electrode 101 and extending along the radial direction of the annular first touch electrode 101, so as to overlap the one first touch electrode.

Figure 5B:
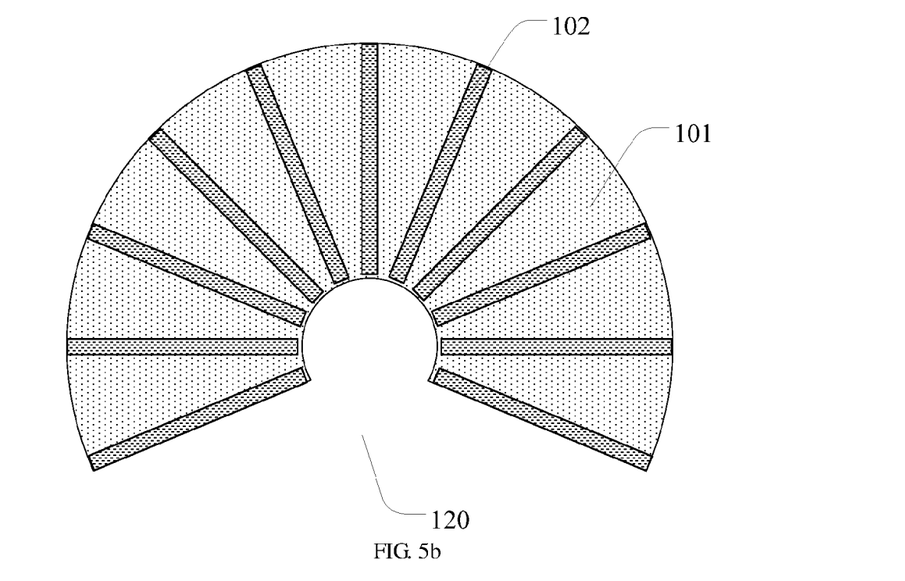
FIG. 5b is a plane schematic diagram of a touch electrode structure provided by another embodiment of the present disclosure.

As show in FIG. 5b, in one example of this embodiment, the one first touch electrode 101 has an opening, which thus can form a first touch electrode 101 of a sector ring shape.

For example, in one example of this embodiment, the touch electrode structure may further include a solid third touch electrode, the third touch electrode is located in the center of the first touch electrode, and is insulated from the first touch electrode and the plurality of second touch electrodes.

In one example of this embodiment, the touch electrode structure may further comprise a plurality of leads 111, and the plurality of leads 111 may be respectively connected with the first touch electrode and the plurality of second touch electrodes so as to be used for inputting/outputting a signal. Alternatively, the plurality of leads may be respectively connected with the first touch electrode, the third touch electrode and the plurality of second touch electrodes so as to be used for inputting/outputting a signal.

For example, previous illustration may be referred to for the third touch electrode and the plurality of leads.

Embodiment Four

Figure 6:
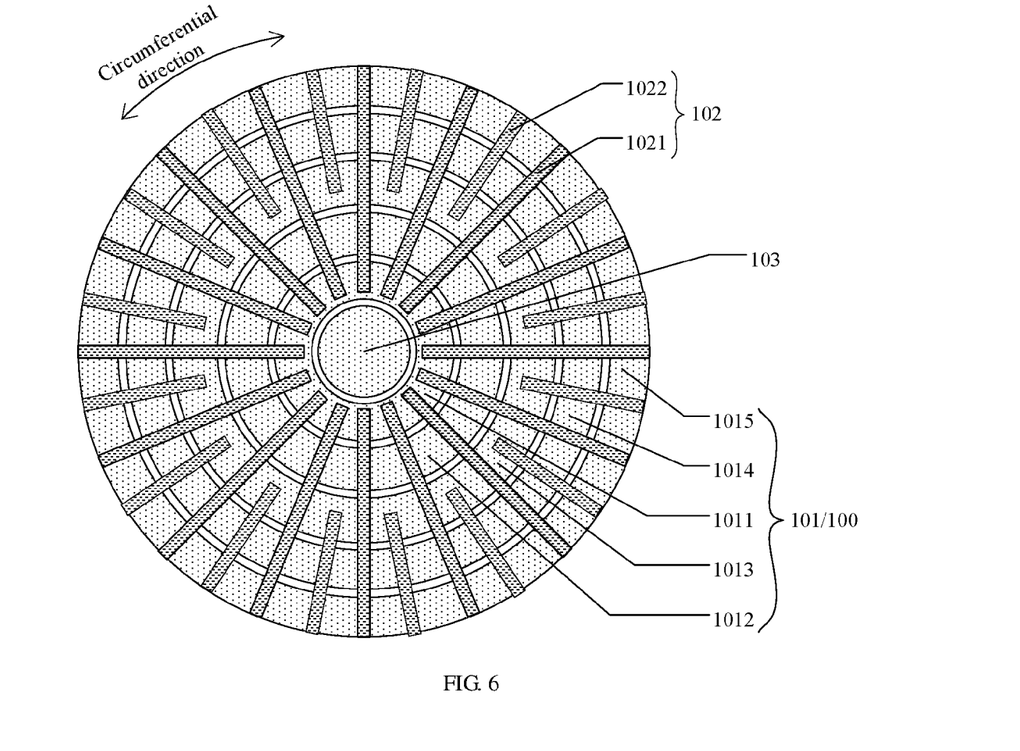
FIG. 6 is a plane schematic diagram of a touch electrode structure provided by another embodiment of the present disclosure.

This embodiment provides a touch electrode structure. As shown in FIG. 6, the touch electrode structure comprises a plurality of first touch electrodes 101 and a plurality of second touch electrodes 102.

For example, as shown in FIG. 6, the plurality of first touch electrodes 101 include a first annular first touch electrode 1011, a second annular first touch electrode 1012, a third annular first touch electrode 1013, a fourth annular first touch electrode 1014, and a fifth annular first touch electrode 1015 sequentially disposed outwardly from a center, so as to constitute a set of concentric rings 100. In addition, two adjacent annular first touch electrodes 101 are disposed sequentially and separated from each other by a certain interval, so as to be insulated from each other. The first annular first touch electrode 1011 is an innermost ring of the concentric rings 100, the fifth annular first touch electrode 1015 is an outermost ring of the concentric rings 100, and the second annular first touch electrode 1012, the third annular first touch electrode 1013 and the fourth annular first touch electrode 1014 are middle rings of the concentric rings 100. That is, among the concentric rings according to the respective embodiments of the present disclosure, what is located on the innermost side is the innermost ring, what is located on the outermost side is the outermost ring, and the rest are the middle rings.

For example, the plurality of second touch electrodes 102 include a first electrode group 1021 and a second electrode group 1022. The first electrode group 1021 extends from the outermost ring to the innermost ring of the concentric rings; and the second electrode group 1022 extends from the outermost ring to a certain middle ring of the concentric rings. For example, as shown in FIG. 6, the first electrode group 1021 is arranged along a circumferential direction of the concentric ring 100 and extends along a radial direction of the concentric ring 100 from a position corresponding to the first annular first touch electrode 1011 to a position corresponding to the fifth annular first touch electrode 1015, so as to overlap the first annular first touch electrode 1011, the second annular first touch electrode 1012, the third annular first touch electrode 1013, the fourth annular first touch electrode 1014, and the fifth annular first touch electrode 1015 as described above. The second electrode group 1022 is arranged along the circumferential direction of the concentric ring 100 and extends along the radial direction of the concentric ring 100 from a position corresponding to the third annular first touch electrode 1013 to the position corresponding to the fifth annular first touch electrode 1015, so as to overlap the third annular first touch electrode 1013, the fourth annular first touch electrode 1014, and the fifth annular first touch electrode 1015 as described above. Thereby, the plurality of second touch electrodes 102 at least overlap an outermost one of the plurality of first touch electrodes. The plurality of second touch electrodes 102 are disposed to insulate from the plurality of first touch electrodes 101. For example, as shown in FIG. 2a or FIG. 2b, a first insulating layer 116 may be disposed between the plurality of first touch electrodes 101 and the plurality of second touch electrodes 102, in order to achieve a purpose of insulating from each other.

It should be noted that, in the embodiment of the present disclosure, description of the foregoing embodiments may be referred to for a positional relationship between a layer where the plurality of second touch electrodes 102 are located and a layer where the plurality of first touch electrodes 101 are located.

For example, in the touch electrode structure provided by this embodiment, as shown in FIG. 6, the concentric ring 100 is a concentric circular ring. The plurality of first touch electrodes 101 are the concentric circular rings. Of course, this embodiment includes, but is not limited thereto. For example, the plurality of first touch electrodes 101 may further be concentric elliptical rings or concentric polygonal rings. For example, the concentric polygonal ring is a concentric regular polygonal ring, for example, a concentric regular pentagonal ring, a concentric regular hexagonal ring and a concentric regular heptagonal ring, and so on. That is to say, the plurality of first touch electrodes 101 of this embodiment may be of a shape of a concentric annular electrode disposed according to the shape of the touch panel/display device. Thus, the touch electrode structure provided by this embodiment may completely cover the entire heteromorphic touch panel, in order to avoid various touch defects brought by incomplete coverage.

In the touch electrode structure provided by Embodiment One and Embodiment Two, due to increase in size, an arrangement density of the second touch electrodes in an outer ring region of the touch electrode structure may be reduced, so that the outer ring region cannot achieve the required touch precision. In this embodiment, by providing the first electrode group 1021 and the second electrode group 1022 as described above, the electrode density in the outer ring region of the touch electrode structure may be increased, so that a problem of the reduced touch precision can be avoided. In addition, by reasonably providing the position and the number of the first electrode group 1021 and the second electrode group 1022, the touch panel using the touch electrode structure provided by this embodiment may achieve higher touch evenness. It is noteworthy that, with further increase in size, the plurality of second touch electrodes 102 are not limited to one group according to the diagram, but may be a plurality of groups, so as to increase the electrode density in the outer ring region, and improve the touch evenness of the touch panel using the touch electrode structure provided by this embodiment.

In the touch electrode structure provided by this embodiment, as shown in FIG. 6, the first electrode group 1021 is evenly arranged along a circumferential direction of the concentric ring 100. The second electrode group 1022 is evenly arranged along the circumferential direction of the concentric ring 100, and the respective second touch electrodes 102 in the second electrode group 1022 are respectively located between the second touch electrodes in the first electrode group 1021. It is noteworthy that, the first electrode group 1021 and the second electrode group 1022 may also be unevenly arranged along the concentric ring 100, and an interval and an angle between them may be adjusted according to specific use environments and needs.

In one example provided by this embodiment, the touch electrode structure may further comprise a solid third touch electrode 103, as shown in FIG. 6, the third touch electrode 103 is disposed inside the first annular first touch electrode 1011, and is separated from the innermost ring of the concentric annular first touch electrode (the first annular first touch electrode 1011), so as to be insulated from the plurality of first touch electrodes 101 and the second touch electrodes 102. For example, the third touch electrode 103 per se may constitute a touch electrode structure of a self-capacitive type, and thus can also increase the touch precision of the center position of the touch panel of the touch electrode structure provided by this embodiment.

For example, as shown in FIG. 6, the third touch electrode 103 is circular. Of course, this embodiment includes, but is not limited thereto. For example, the third touch electrode 103 may also be elliptical, polygonal, or of other shapes. That is to say, the third touch electrode 103 according to this embodiment may be determined according to the shape of the touch panel or the shape of the first annular first touch electrode 1011, and in a case where the plurality of first touch electrodes 101 have an opening, the third touch electrode 103 may correspondingly have an opening or not have an opening. With reference to an example shown in FIG. 3, the third touch electrode 103 may also overlap one of the second touch electrodes 102 so as to work as a touch electrode of a mutual-capacitive type.

For example, in this embodiment, the touch electrode structure may further comprise a plurality of leads 111, with reference to FIG. 2a and FIG. 2b, the plurality of leads 111 are respectively connected with the plurality of first touch electrodes 101 and the plurality of second touch electrodes 102 so as to be used for inputting/outputting a signal, or the plurality of leads 111 are respectively connected with the plurality of first touch electrodes 101, the plurality of second touch electrodes 102, and the third touch electrode 103 so as to be used for inputting/outputting a signal. Illustration of Embodiment One may be referred to for a specific configuration mode of the plurality of leads 111, which will not be repeated here.

For example, the plurality of leads 111 may be connected with the touch detection chip, the touch detection chip inputs/outputs a signal through the lead 111, and receives signals of the respective touch electrodes by analysis, so as to determine the touch position.

In this embodiment, description of the foregoing embodiments may be referred to for a material of the plurality of first touch electrodes 101 and/or the plurality of second touch electrodes 102 and/or the third touch electrode 103.

In this embodiment, a capacitive structure is formed in a position where the plurality of first touch electrodes 101 and the plurality of second touch electrodes 102 overlap with each other. When there is a finger touch, coupling of capacitor near the touch point is influenced, so as to change capacitance of the capacitor near the touch point. Thus, the touch position can be determined by using such a change of the capacitance. The plurality of first touch electrodes 101 according to this embodiment may be any concentric annular electrode disposed according to the shape of the touch panel/the display device as required, which can effectively and completely cover the heteromorphic touch panel, avoid defects such as inaccurate reporting points or poor linearity because an edge of the touch panel or the touch electrode at the corner is not completely covered. In addition, the third touch electrode 103 disposed in the center of the concentric ring 100 may be a touch electrode of a self-capacitive type, and can improve touch precision of a center position of the touch panel using the touch electrode structure provided by this embodiment.

It should be noted that, in the respective embodiments of the present disclosure, the plurality of first touch electrodes 101 include four or five annular first touch electrodes, but the number of the annular first touch electrodes is not limited thereto. The "plurality of" according to the embodiment of the present disclosure refers to more than one, i.e., greater than or equal to two. According to requirement such as an optical property of the transparent conductive material used, a size of the touch panel, precision and an aperture ratio, the number of the plurality of first touch electrodes 101 and the plurality of second touch electrodes 102 and an interval may change according to an actual situation. For example, when the transparent conductive material used has a lower transparency, and a required precision is lower, in order to increase the aperture ratio, the number of the plurality of first touch electrodes 101 may be reduced, the interval thereof is increased; the number of the plurality of second touch electrodes 102 is reduced, and the interval thereof is increased. Conversely, when the transparent conductive material used has a higher transparency, and a required precision is higher, the number of the first touch electrodes 101 may be increased, the interval thereof is reduced; the number of the plurality of second touch electrodes 102 is increased, and the interval thereof is reduced.

In addition, the touch electrode structure provided by the respective embodiments of the present disclosure, not only can be applied to a conventional planar touch panel, but also, due to its unique arrangement mode of the touch electrodes, can be applied to a touch panel of a curved surface, even a touch panel of a spherical surface, and can achieve a better touch effect.

Embodiment Five

This embodiment provides a touch panel, comprising any touch electrode structure as described above. For example, the touch panel may include any one of a touch panel of a One Glass Solution (OGS) type, an In-Cell touch panel, or an On-Cell touch panel. A structure of the touch panel of the OGS type provided by this embodiment may be, for example, as shown in FIG. 2a and FIG. 2b.

Figure 7:
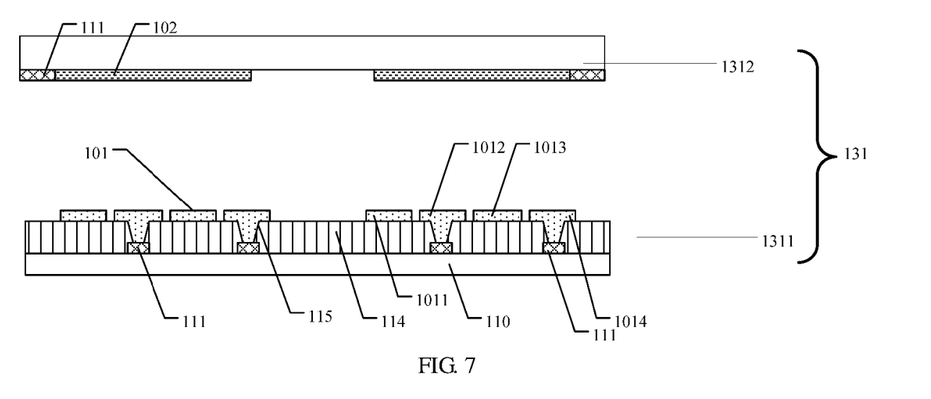
FIG. 7 is a schematic diagram of a touch panel provided by an embodiment of the present disclosure.

For example, in the In-Cell touch panel, at least one first touch electrode and a plurality of second touch electrodes may be located on a surface of an upper substrate facing a lower substrate, or on a surface of the lower substrate facing the upper substrate, or respectively located on the surface of the lower substrate facing the upper substrate, and the surface of the upper substrate facing the lower substrate. FIG. 7 shows that the plurality of first touch electrodes and the plurality of second touch electrodes are respectively located on a surface of a lower substrate 1311 facing an upper substrate 1312, and a surface of the upper substrate 1312 facing the lower substrate 1311. The display panel 131 includes the upper substrate 1312 and the lower substrate 1311.

Figure 8:
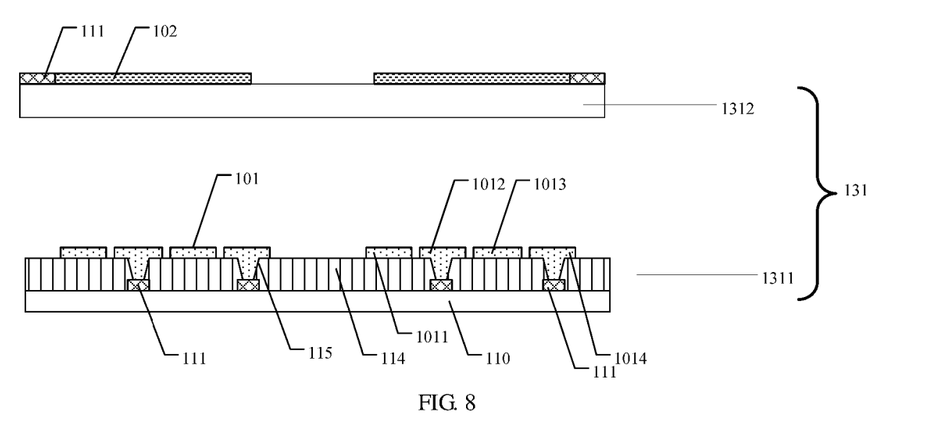
FIG. 8 is a schematic diagram of another touch panel provided by an embodiment of the present disclosure.

For example, in the On-Cell Touch panel, the at least one first touch electrode and the plurality of second touch electrodes may be respectively located on a side of the upper substrate close to the lower substrate, and on a side of the upper substrate away from the lower substrate, or the at least one first touch electrode and the plurality of second touch electrodes may be respectively located on the side of the lower substrate close to the upper substrate, and on the side of the upper substrate away from the lower substrate, or, the at least one first touch electrode and the plurality of second touch electrodes are both located on the side of the upper substrate away from the lower substrate. FIG. 8 shows that the plurality of first touch electrodes 101 are located on a side of the lower substrate 1311 close to the upper substrate 1312, and the plurality of second touch electrodes 102 are located on a side of the upper substrate 1312 away from the lower substrate 1311. The display panel 131 includes the lower substrate 1311 and the upper substrate 1312 being cell-assembled. For example, the lower substrate 1311 is further provided thereon with a pixel array structure, and the upper substrate 1312 may be further provided thereon with a color filter layer, a black matrix, and the like.

For example, in one example of this embodiment, the touch panel further includes a touch detection chip.

In the touch panel provided by this embodiment, a mutual capacitive structure may be formed in a position where the plurality of first touch electrodes 101 and the plurality of second touch electrodes 102 overlap with each other. When there is a finger touching the touch panel, coupling of capacitor near the touch point is influenced, so as to change capacitance of the capacitor near the touch point. The touch detection chip determines the touch position in the touch period by detecting such a change of the capacitance value.

It should be noted that, in order to express clearly, an entire structure of the touch panel is not given. In order to implement a necessary function of the touch panel, those skilled in the art may set other unexpressed structures according to a specific application scenario, which will not be limited by the present disclosure. The technical effect of the touch electrode structure illustrated in Embodiments One, Two and Three as described above are referred to for the technical effect of the touch panel provided by this embodiment, which will not be repeated here.

Embodiment Six

This embodiment provides a display device, comprising any touch electrode structure as described above.

For example, the display device further comprises a display panel, the display panel comprising any touch electrode structure as described above. The display device of such structure is, for example, an In-Cell touch display panel or an On-Cell touch display panel. Illustration of Embodiment Five may be referred to for the touch electrode structure in the In-Cell touch display panel or the On-Cell touch display panel.

Figure 9:
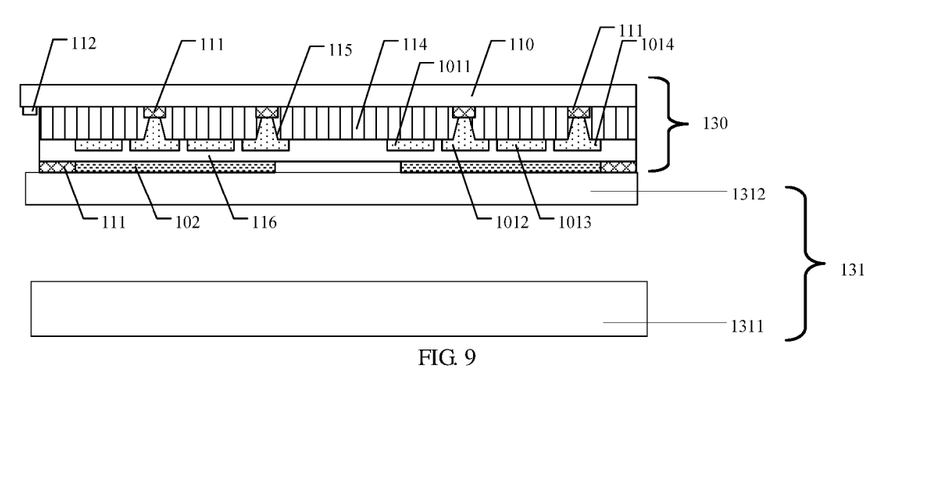
FIG. 9 is a schematic diagram of a display device provided by an embodiment of the present disclosure.

For example, as shown in FIG. 9, the display device further comprises a display panel 131 and a touch panel 130 disposed on a display side of the display panel, the touch panel including any touch electrode structure as described above. The display device of such structure, for example, comprises a display panel of a One Glass Solution (OGS) type.

For example, the display device comprises a liquid crystal display device or an organic light emitting diode display device.

For example, the display device may be: a display device such as a liquid crystal display device, E-paper, an Organic Light-Emitting Diode (OLED) and so on, and a television, a digital camera, a mobile phone, a watch, a tablet personal computer, a notebook computer, a navigator and any other product or component having a display function including these display devices.

It should be noted that, in order to express clearly, an entire structure of the display device is not given. In order to implement a necessary function of the display device, those skilled in the art may set other unexpressed structure according to a specific application scenario, which will not be limited by the present disclosure. The technical effect of the display device illustrated in Embodiments One, Two and Three as described above are referred to for the technical effect of the display device provided by this embodiment, which will not be repeated here.

At least one embodiment of the present disclosure provides a touch electrode structure, and a touch panel and a display device comprising the touch electrode structure. The touch electrode structure comprises at least one first touch electrode and a plurality of second touch electrodes, the at least one first touch electrode is annular; the plurality of second touch electrodes are insulated from the at least one first touch electrode, the plurality of second touch electrodes are arranged along a circumferential direction of the annular first touch electrode and extend along a radial direction of the annular first touch electrode, so as to overlap at least one first touch electrode. The plurality of second touch electrodes may further include a first electrode group and a second electrode group. The touch electrode structure and the touch panel and the display device comprising the touch electrode structure have at least one of advantageous effects as follows:

(1) The plurality of first touch electrodes according to at least one embodiment of the present disclosure may be any concentric annular electrode disposed according to the shape of the touch panel. Thus, the touch electrode structure provided by at least one embodiment of the present disclosure can be used in the heteromorphic touch panel, which can effectively and completely cover the non-rectangular (heteromorphic) touch panel, avoid defects such as inaccurate reporting points or poor linearity because the edge of the touch panel or the touch electrode at the corner is not completely covered. The touch electrode structure provided by the respective embodiments of the present disclosure can cover the entire heteromorphic touch panel, or cover the non-rectangular touch region (the non-rectangular touch panel includes the non-rectangular touch region, and besides, for example, may include one or more rectangular regions. For example, the rectangular region may be provided therein with a touch electrode of a general rectangular structure).

(2) In the touch electrode structure provided by at least one embodiment of the present disclosure, by reasonably providing the position and the number of the first electrode group and the second electrode group, the touch panel using the touch electrode structure may achieve higher touch evenness.

(3) The touch electrode structure provided by at least one embodiment of the present disclosure may further include the third touch electrode disposed in the center of the concentric ring. The third touch electrode may use a structure of a self-capacitive type or a structure of a mutual-capacitive type which is constituted by overlapping at least one second electrode, so as to increase the touch precision of the center position of the touch panel using the touch electrode structure.

(4) The touch electrode structure provided by at least one embodiment of the present disclosure not only can be applied to a conventional planar touch panel, but also, due to its unique arrangement mode of the touch electrodes, can be applied to a touch panel of a curved surface, even a touch panel of a spherical surface, and can achieve a better touch effect.

(5) The touch electrode structure provided by at least one embodiment of the present disclosure may, by combining with a general touch electrode structure, form a variety of non-rectangular (heteromorphic) touch electrode structures, achieve a better touch performance, and in addition, may have characteristics of fashion and aesthetics, so as to meet various needs of the user.

There are some points to be illustrated:

(1) Drawings of the embodiments of the present disclosure only refer to structures related with the embodiments of the present disclosure, and other structures may refer to general design.

(2) In order to make it clear, in the drawings for illustrating the embodiment of the present disclosure, a thickness of a layer or a region is magnified or reduced, that is, those drawings are not drawn according to actual proportion. It should be understood that, when elements such as a layer, a film, a region or a substrate and the like are called to be "above" or "below" another element, the element may be directly located "above" or "below" the other element, or there may be an intermediate element.

(3) In a case of no conflict, the embodiments of the present disclosure and the features of the embodiments may be combined with each other to form new embodiments.

The foregoing embodiments are only specific embodiments of the disclosure, but the protection scope of the disclosure is not limited by this, and the protection scope of the present disclosure is determined by a protection scope of claims.

The present application claims priority of Chinese Patent Application No. 201510543665.1 filed on Aug. 28, 2015, the disclosure of which is incorporated herein by reference in its entirety as part of the present application.

The invention claimed is:

1. A touch electrode structure, comprising at least one first touch electrode and a plurality of second touch electrodes, wherein,
the at least one first touch electrode is of annular shape;
the plurality of second touch electrodes are insulated from the at least one first touch electrode, the plurality of second touch electrodes are arranged along a circumferential direction of the annular first touch electrode and extend along a radial direction of the annular first touch electrode, so as to overlap the at least one first touch electrode,
wherein, the plurality of second touch electrodes include a first electrode group and a second electrode group, the first electrode group extends from an outermost ring to an innermost ring of the concentric rings and the second electrode group extends from the outermost ring to a middle ring of the concentric rings.

2. The touch electrode structure according to claim 1, comprising a plurality of first touch electrodes, wherein, each of the plurality of first touch electrodes is of annular shape, and the plurality of first touch electrodes are sequentially arranged to constitute a set of concentric rings, the plurality of first touch electrodes are insulated from each other, the plurality of second touch electrodes are arranged along a circumferential direction of the concentric rings and extend along a radial direction of the concentric rings, so as to overlap at least one on an outermost side in the plurality of first touch electrodes.

3. The touch electrode structure according to claim 2, wherein, the plurality of second touch electrodes are evenly arranged along the circumferential direction of the concentric rings.

4. The touch electrode structure according to claim 1, wherein, the plurality of second touch electrodes are evenly arranged along the circumferential direction of the concentric rings.

5. The touch electrode structure according to claim 1, further comprising a solid third touch electrode, wherein, the third touch electrode is located in a center of the annular first touch electrode, and is insulated from the respective first touch electrodes and the respective second touch electrodes.

6. The touch electrode structure according to claim 5, wherein, the third touch electrode overlaps one of the plurality of second touch electrodes.

7. The touch electrode structure according to claim 5, wherein, the third touch electrode does not overlap any one of the plurality of second touch electrodes.

8. The touch electrode structure according to claim 1, wherein, the annular shape includes a circular ring, an elliptical ring or a polygonal ring.

9. The touch electrode structure according to claim 8, wherein, the polygonal ring is a regular polygonal ring.

10. The touch electrode structure according to claim 1, wherein, the annular shape is closed or open.

11. The touch electrode structure according to claim 1, wherein, the first touch electrode is a touch driving electrode, and the second touch electrode is a touch sensing electrode; or
the first touch electrode is a touch sensing electrode, and the second touch electrode is a touch driving electrode.

12. The touch electrode structure according to claim 1, further comprising a plurality of leads, wherein, the plurality of leads are respectively connected with the respective first touch electrodes and the respective second touch electrodes so as to be used for inputting/outputting a signal.

13. The touch electrode structure according to claim 1, wherein, a material of the at least one first touch electrode and/or the plurality of second touch electrodes is a transparent conductive material.

14. A touch panel, comprising the touch electrode structure according to claim 1.

15. A display device, comprising the touch electrode structure according to claim 1.

16. The display device according to claim 15, further comprising a display panel, wherein, the display panel includes the touch electrode structure.

17. The display device according to claim 15, further comprising a display panel and a touch panel disposed on a display side of the display panel, the touch panel including the touch electrode structure.

18. The display device according to claim 15, wherein, the display panel includes a liquid crystal display panel or an organic light emitting diode display panel.

19. The touch electrode structure according to claim 1, wherein, the second electrode group extends from the outermost ring to a same middle ring of the concentric rings.

20. The touch electrode structure according to claim 1, wherein, each of the second touch electrodes in the second electrode group is respectively located between the second touch electrodes in the first electrode group.

* * * * *